(12) United States Patent
Kim et al.

(10) Patent No.: US 12,082,434 B2
(45) Date of Patent: Sep. 3, 2024

(54) LIGHT-EMITTING DEVICE HAVING LOW DRIVING VOLTAGE, HIGH LUMINESCENCE EFFICIENCY, AND LONG LIFE SPAN, AND ELECTRONIC APPARATUS INCLUDING SAME

(71) Applicant: Samsung Display Co., Ltd., Yongin-si (KR)

(72) Inventors: Soungwook Kim, Yongin-si (KR); Seokgyu Yoon, Yongin-si (KR); Kyungsik Kim, Yongin-si (KR); Eungdo Kim, Yongin-si (KR); Jaejin Lyu, Yongin-si (KR); Kunwook Cho, Yongin-si (KR); Hyeongu Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 257 days.

(21) Appl. No.: 17/361,873

(22) Filed: Jun. 29, 2021

(65) Prior Publication Data
US 2022/0020950 A1    Jan. 20, 2022

(30) Foreign Application Priority Data
Jul. 17, 2020   (KR) .................. 10-2020-0089154

(51) Int. Cl.
*H10K 50/818*   (2023.01)
(52) U.S. Cl.
CPC .................. *H10K 50/818* (2023.02)

(58) Field of Classification Search
None
See application file for complete search history.

(56) References Cited

U.S. PATENT DOCUMENTS

| 7,915,812 B2 | 3/2011 | Hasegawa |
| 10,079,357 B2 | 9/2018 | Song et al. |
| 10,276,833 B2 | 4/2019 | Lee et al. |

(Continued)

FOREIGN PATENT DOCUMENTS

| JP | 5760699 | 8/2015 |
| KR | 10-2005-0067057 | 6/2005 |

(Continued)

*Primary Examiner* — Daniel Whalen
(74) *Attorney, Agent, or Firm* — Lewis Roca Rothgerber Christie LLP

(57) ABSTRACT

A light-emitting device including: first and second electrodes facing each other; an emission layer located therebetween; and a charge transport region located between the emission layer and the first electrode. Light emitted from the emission layer passes to the outside through the second electrode, the first electrode is a reflective electrode, the first electrode includes a transparent layer and a reflective layer, a distance between i) an interface between the transparent layer of the first electrode and the charge transport region and ii) an interface between the emission layer and the charge transport region is a first resonance distance of light emitted from the emission layer, and a distance between a) an interface between the reflective layer of the first electrode and the transparent layer of the first electrode and b) an interface between the emission layer and the charge transport region is a second resonance distance of light emitted from the emission layer.

19 Claims, 3 Drawing Sheets

(56) References Cited

U.S. PATENT DOCUMENTS

| | | |
|---|---|---|
| 2005/0140288 A1 | 6/2005 | Suzuki |
| 2011/0114981 A1 | 5/2011 | Higaki et al. |
| 2011/0297977 A1 | 12/2011 | Kajimoto |
| 2018/0269265 A1* | 9/2018 | Kim .................. H10K 59/32 |
| 2020/0152884 A1 | 5/2020 | Hwang et al. |
| 2021/0083017 A1* | 3/2021 | Komatsu ............. H10K 50/165 |
| 2021/0234115 A1 | 7/2021 | Seo et al. |

FOREIGN PATENT DOCUMENTS

| | | |
|---|---|---|
| KR | 10-0846608 | 7/2008 |
| KR | 10-2009-0092731 A | 9/2009 |
| KR | 10-2017-0015620 | 2/2017 |
| KR | 10-1821739 | 1/2018 |
| KR | 10-1866390 | 6/2018 |
| WO | 2019220283 | 11/2019 |

* cited by examiner

LIGHT-EMITTING DEVICE HAVING LOW DRIVING VOLTAGE, HIGH LUMINESCENCE EFFICIENCY, AND LONG LIFE SPAN, AND ELECTRONIC APPARATUS INCLUDING SAME

CROSS-REFERENCE TO RELATED APPLICATION

This application claims priority from and the benefit of Korean Patent Application No. 10-2020-0089154, filed on Jul. 17, 2020, which is hereby incorporated by reference for all purposes as if fully set forth herein.

BACKGROUND

Field

Exemplary embodiments of the invention relate to a light-emitting device and an electronic apparatus including the light-emitting device.

Discussion of the Background

Organic light-emitting devices (OLEDs) among light-emitting devices are self-emission devices that, as compared with devices in the art, have wide viewing angles, high contrast ratios, short response times, and excellent characteristics in terms of brightness, driving voltage, and response speed.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state to thereby generate light.

The above information disclosed in this Background section is only for understanding of the background of the inventive concepts, and, therefore, it may contain information that does not constitute prior art.

SUMMARY

Exemplary embodiments relate to a light-emitting device and an electronic apparatus including the light-emitting device, the light-emitting device having low driving voltage, high luminescence efficiency and long lifespan at the same time.

Additional aspects will be set forth in part in the description which follows and, in part, will be apparent from the description, or may be learned by practice of the invention.

An exemplary embodiment of the invention provides a light-emitting device includes: a first electrode; a second electrode facing the first electrode; an emission layer located between the first electrode and the second electrode; and a charge transport region located between the emission layer and the first electrode. The light emitted from the emission layer passes to the outside through the second electrode, the first electrode is a reflective electrode, the first electrode includes a transparent layer and a reflective layer, and Equation 1 and Equation 2 are satisfied as follows:

$$L_1-a_1 \leq D_1 \leq L_1+a_1 \qquad \text{Equation 1}$$

wherein, in Equation 1, $D_1$ is a distance between i) an interface between the transparent layer of the first electrode and the charge transport region and ii) an interface between the emission layer and the charge transport region, $L_1$ is a first resonance distance of light emitted from the emission layer, and $a_1$ is a real number in a range of about 0 nanometers (nm) to about 50 nm, $$L_2-a_2 \leq D_2 \leq L_2+a_2 \qquad \text{Equation 2}$$

wherein, in Equation 2, $D_2$ is a distance between a) an interface between the reflective layer of the first electrode and the transparent layer of the first electrode and b) an interface between the emission layer and the charge transport region, $L_2$ is a second resonance distance of light emitted from the emission layer, and $a_2$ is a real number in a range of about 0 nm to about 50 nm. Another exemplary embodiment of the invention provides a light-emitting device including: a first electrode; a second electrode facing the first electrode; emission units in the number of x stacked between the first electrode and the second electrode; and x−1 charge generating layer(s) located between each two adjacent emission units from among the emission units in the number of x, each of the x−1 charge generating layer(s) including an n-type charge generating layer and a p-type charge generating layer, wherein x is an integer of 2 or greater, each of the emission units in the number of x includes a charge transport region and an emission layer that are sequentially stacked above the first electrode. Light emitted from the emission units in the number of x passes to the outside through the second electrode, the first electrode is a reflective electrode, the first electrode includes a transparent layer and a reflective layer, and Equation y and Equation y+1 are satisfied as follows:

$$L_y-a_y \leq D_y \leq L_y+a_y \qquad \text{Equation y}$$

wherein, in Equation y, $D_y$ is a distance between i) an interface between the transparent layer of the first electrode and the charge transport region of a $y^{th}$ emission unit from among the emission units in the number of x and ii) an interface between the emission layer of the $y^{th}$ emission unit from among the emission units in the number of x and the charge transport region of the $y^{th}$ emission unit from among the emission units in the number of x, $L_y$ is a $y^{th}$ resonance distance of light emitted from the emission layer of the $y^{th}$ emission unit from among the emission units in the number of x, and $a_y$ is a real number in a range of about 0 nm to about 50 nm, $$L_{y+1}-a_{y+1} \leq D_{y+1} \leq L_{y+1}+a_{y+1} \qquad \text{Equation y+1}$$

wherein, in Equation y+1, $D_{y+1}$ is a distance between a) an interface between the reflective layer of the first electrode and the transparent layer of the first electrode and b) an interface between the emission layer of the $y^{th}$ emission unit from among the emission units in the number of x and the charge transport region of the $y^{th}$ emission unit from among the emission units in the number of x, $L_{y+1}$ is a $(y+1)^{th}$ resonance distance of light emitted from the emission layer of the $y^{th}$ emission unit from among the emission units in the number of x, and $a_{y+1}$ is a real number in a range of about 0 nm to about 50 nm.

Another exemplary embodiment of the invention provides a light-emitting device may including: a first electrode; a second electrode facing the first electrode; a first emission unit located between the first electrode and the second electrode; a second emission unit located between the first emission unit and the second electrode; and a charge generating layer located between the first emission unit and the second emission unit and including an n-type charge generating layer and a p-type charge generating layer. The first emission unit includes a first charge transport region and a first emission layer that are sequentially stacked on the first electrode, the second emission unit includes a second charge transport region and a second emission layer that are sequentially stacked on the first electrode, light emitted from the first emission unit and the second emission unit pass to the outside through the second electrode, the first electrode is a reflective electrode, the first electrode includes a transparent layer and a reflective layer, and Equation 11, Equation 12, Equation 22, and Equation 23 are satisfied as follows:

$$L_{11} - a_{11} \leq D_{11} \leq L_{11} + a_{11} \qquad \text{Equation 11}$$

wherein, in Equation 11, $D_{11}$ is a distance between i) an interface between the transparent layer of the first electrode and the first charge transport region of the first emission unit and ii) an interface between the first emission layer of the first emission unit and the first charge transport region of the first emission unit, $L_{11}$ is a first resonance distance of light emitted from the first emission layer of the first emission unit, and $a_{11}$ is a real number in a range of about 0 nm to about 50 nm, $$L_{12} - a_{12} \leq D_{12} \leq L_{12} + a_{12} \qquad \text{Equation 12}$$

wherein, in Equation 12, $D_{12}$ is a distance between a) an interface between the reflective layer of the first electrode and the transparent layer of the first electrode and b) an interface between the first emission layer of the first emission unit and the first charge transport region of the first emission unit, $L_{12}$ is a second resonance distance of light emitted from the first emission layer of the first emission unit, and $a_{12}$ is a real number in a range of about 0 nm to about 50 nm, $$L_{22} - a_{22} \leq D_{22} \leq L_{22} + a_{22} \qquad \text{Equation 22}$$

wherein, in Equation 22, $D_{22}$ is a distance between iii) an interface between the transparent layer of the first electrode and the second charge transport region of the second emission unit and iv) an interface between the second emission layer of the second emission unit and the second charge transport region of the second emission unit, $L_{22}$ is a second resonance distance of light emitted from the second emission layer of the second emission unit, and $a_{22}$ is a real number in a range of about 0 nm to about 50 nm, and $$L_{23} - a_{23} \leq D_{23} \leq L_{23} + a_{23} \qquad \text{Equation 23}$$

wherein, in Equation 23, $D_{23}$ is a distance between c) an interface between the reflective layer of the first electrode and the transparent layer of the first electrode and d) an interface between the second emission layer of the second emission unit and the second charge transport region of the second emission unit, $L_{23}$ is a third resonance distance of light emitted from the second emission layer of the second emission unit, and $a_{23}$ is a real number in a range of about 0 nm to about 50 nm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE ILLUSTRATED EMBODIMENTS

Figure 1:
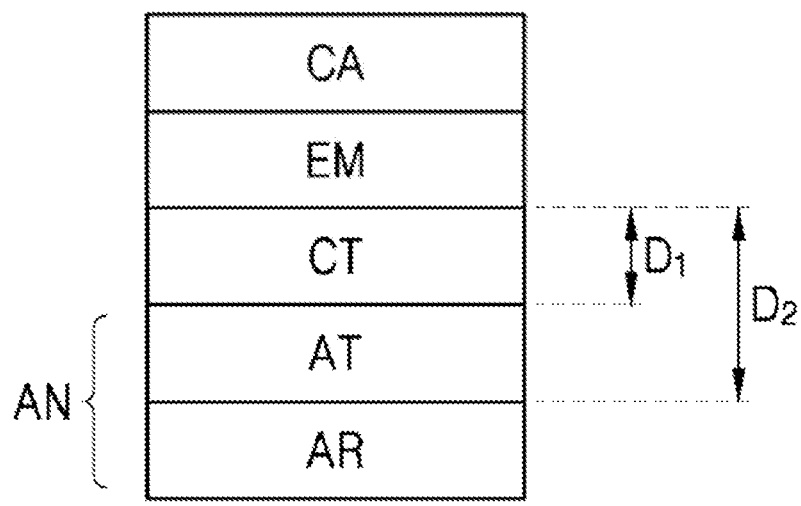
FIG. 1 is a schematic view of a light-emitting device 10 according to an exemplary embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Description of FIG. 1

A light-emitting device 10 in FIG. 1 includes: a first electrode AN; a second electrode CA facing the first electrode AN; an emission layer EM located between the first electrode AN and the second electrode CA; and a charge transport region CT located between the emission layer EM and the first electrode AN.

The charge transport region CT may have i) a single layer structure consisting of a single material, ii) a single layer structure consisting of at least two different materials, or iii) a multi-layered structure including various different materials.

The first electrode AN may be a hole-injecting electrode (e.g., an anode), and the second electrode CA may be an electron-injecting electrode (i.e., a cathode).

The first electrode AN in FIG. 1 may be a hole-injecting electrode, and the charge transport region CT may be a hole transport region.

The hole transport region may include a hole injection layer, a hole transport layer, an electron blocking layer, a buffer layer, or a combination thereof.

The hole transport region may include a compound having hole transport characteristics. The hole transport region may include a dibenzofuran-containing compound, a dibenzothiophene-containing compound, a carbazole-containing compound, a fluorene-containing compound, amine-containing compound, p-dopant, or any combination thereof.

Although not shown in FIG. 1, another charge transport region (e.g., an electron transport region) may be further disposed between the emission layer EM and the second electrode CA.

The first electrode AN in FIG. 1 may be a hole-injecting electrode, the charge transport region CT may be a hole transport region, and an electron transport region may be further disposed between the emission layer EM and the second electrode CA.

The electron transport region may have i) a single layer structure consisting of a single material, ii) a single layer structure consisting of at least two different materials, or iii) a multi-layered structure including various different materials. The electron transport region may include a hole blocking layer, an electron transport layer, an electron injection layer, or a combination thereof.

Light emitted from the emission layer EM may pass to the outside the light-emitting device 10 through the second electrode CA.

The emission layer EM may emit blue light, green light, red light, and/or white light.

In some exemplary embodiments, light emitted from the emission layer EM may be blue light having a maximum emission wavelength in a range of about 440 nm to about 495 nm, green light having a maximum emission wavelength in a range of about 495 nm to about 570 nm, or red light having a maximum emission wavelength in a range of about 590 nm to about 750 nm.

Light emitted from the emission layer EM may be blue light.

The first electrode AN may be a reflective electrode, and the first electrode AN may include a transparent layer AT and a reflective layer AR.

In some exemplary embodiments, as shown in FIG. 1, the transparent layer AT of the first electrode AN may be disposed between the reflective layer AR of the first electrode AN and the charge transport region CT.

The light-emitting device 10 may satisfy Equation 1:

$$L_1-a_1 \leq D_1 \leq L_1+a_1 \qquad \text{Equation 1}$$

wherein, in Equation 1, $D_1$ may be a distance between i) an interface between the transparent layer AT of the first electrode AN and the charge transport region CT and ii) an interface between the emission layer EM and the charge transport region CT, $L_1$ may be a first resonance distance of light emitted from the emission layer EM, and $a_1$ may be a real number in a range of about 0 nm to about 50 nm.

$a_1$ may be, for example, a real number in a range of about 40 nm to about 50 nm, a real number in a range of about 30 nm to about 40 nm, a real number in a range of about 20 nm to about 30 nm, a real number in a range of about 10 nm to about 20 nm, or a real number in a range of about 0 nm to about 10 nm.

As the light-emitting device 10 satisfies Equation 1, a thickness of an region, in which organic matters are substantially disposed, between i) an interface between the transparent layer AT of the first electrode AN and the charge transport region CT and ii) an interface between the emission layer EM and the charge transport region CT may be maintained in a relatively small thickness, thus having a low driving voltage, long lifespan, and a high external light extraction efficiency.

In addition, the light-emitting device 10 may satisfy Equation 2:

$$L_2 - a_2 \leq D_2 \leq L_2 + a_2 \qquad \text{Equation 2}$$

wherein, in Equation 2, $D_2$ may be a distance between a) an interface between the reflective layer AR of the first electrode AN and the transparent layer AT of the first electrode AN and b) an interface between the emission layer EM and the charge transport region CT, $L_2$ may be a second resonance distance of light emitted from the emission layer EM, and $a_2$ may be a real number in a range of about 0 nm to about 50 nm.

$a_2$ may be, for example, a real number in a range of about 40 nm to about 50 nm, a real number in a range of about 30 nm to about 40 nm, a real number in a range of about 20 nm to about 30 nm, a real number in a range of about 10 nm to about 20 nm, or a real number in a range of about 0 nm to about 10 nm.

As the light-emitting device 10 satisfies Equation 2, the emission layer EM and the reflective layer AR of the first electrode AN may be spaced apart from each other in a proper distance, and thus, light (i.e., light emitted from the emission layer EM) loss caused by quenching and waveguide due to surface plasmon polariton (SPP) may be substantially reduced. Accordingly, the light-emitting device 10 may have a high external light extraction efficiency.

In some exemplary embodiments, $L_1$ in Equation 1 may be represented by Equation 1A:

$$L_1 = \{[(m_1 - 1) + 0.5] \times \lambda\}/2r_1 \qquad \text{Equation 1A}$$

wherein, in Equation 1A, $\lambda$ represents a maximum emission wavelength of light emitted from the emission layer EM, $r_1$ represents an effective refractive index of an region located between the transparent layer AT of the first electrode AN and the emission layer EM, and $m_1$ may be 1.

$r_1$ may vary depending on compounds included in the region located between the transparent layer AT of the first electrode AN and the emission layer EM, and $r_1$ may be, for example, in a range of about 1.5 to about 2.1.

The region located between the transparent layer AT of the first electrode AN and the emission layer EM may be, for example, the charge transport region CT.

In some exemplary embodiments, the "effective refractive index", as used herein, may be evaluated by using an ellipsometer. For example, the effective refractive index of a region located between the transparent layer AT of the first electrode AN and the emission layer EM may be evaluated by using an ellipsometer. In some exemplary embodiments, the effective refractive index may be evaluated by measuring a refractive index of a layer by using an ellipsometer, wherein the layer is formed to a predetermined thickness (e.g., 30 nm) by depositing, on a glass substrate, materials included in the region located between the transparent layer AT of the first electrode AN and the emission layer EM.

In one or more exemplary embodiments, in Equation 2, $L_2$ may be represented by Equation 2A:

$$L_2 = \{[(m_2 - 1) + 0.5] \times \lambda\}/2r_2 \qquad \text{Equation 2A}$$

wherein, in Equation 2A, $\lambda$ represents a maximum emission wavelength of light emitted from the emission layer EM, $r_2$ represents an effective refractive index of an region located between the reflective layer AR of the first electrode AN and the emission layer EM, and $m_2$ may be 2.

$r_2$ may vary depending on compounds included in the region located between the reflective layer AR of the first electrode AN and the emission layer EM, and $r_1$ may be, for example, in a range of about 1.6 to about 2.5.

The region located between the reflective layer AR of the first electrode AN and the emission layer EM may be, for example, the transparent layer AT between the charge transport region CT and the first electrode AN.

The effective refractive index of the region located between the reflective layer AR of the first electrode AN and the emission layer EM may be measured by using the method described herein.

In one or more exemplary embodiments, the light-emitting device 10 may satisfy Equation 3:

$$n_1 \geq n_2 \qquad \text{Equation 3}$$

wherein, in Equation 3, $n_1$ may be a refractive index of the transparent layer AT of the first electrode AN, and $n_2$ may be a refractive index of a layer in direct contact with the transparent layer AT of the first electrode AN from among layers included in the charge transport region CT.

In one or more exemplary embodiments, the light-emitting device 10 may satisfy Equation 4:

$$n_1 - n_2 \geq 0.1 \qquad \text{Equation 4}$$

$n_1$ and $n_2$ in Equation 4 may respectively be understood by referring to the descriptions of $n_1$ and $n_2$ provided herein.

In one or more exemplary embodiments, blue light emitted from the emission layer EM (e.g., blue light having a maximum emission wavelength in a range of about 450 nm to about 495 nm), and $D_1$ in Equation 1 may be in a range of about 10 nm to about 60 nm, e.g., about 30 nm to about 60 nm.

In one or more exemplary embodiments, blue light emitted from the emission layer EM (e.g., blue light having a maximum emission wavelength in a range of about 450 nm to about 495 nm), and $D_2$ in Equation 2 may be in a range of about 50 nm to about 180 nm, e.g., about 100 nm to about 180 nm.

In one or more exemplary embodiments, green light emitted from the emission layer EM (e.g., green light having a maximum emission wavelength in a range of about 495 nm to about 570 nm), and $D_1$ in Equation 1 may be in a range of about 40 nm to about 95 nm, e.g., about 50 nm to about 85 nm.

In one or more exemplary embodiments, green light emitted from the emission layer EM (e.g., green light having a maximum emission wavelength in a range of about 495 nm to about 570 nm), and $D_2$ in Equation 2 may be in a range of about 80 nm to about 215 nm, e.g., about 100 nm to about 195 nm.

In one or more exemplary embodiments, red light emitted from the emission layer EM (e.g., red light having a maximum emission wavelength in a range of about 590 nm to about 750 nm), and $D_1$ in Equation 1 may be in a range of about 60 nm to about 145 nm, e.g., about 60 nm to about 125 nm.

In one or more exemplary embodiments, red light emitted from the emission layer EM (e.g., red light having a maximum emission wavelength in a range of about 590 nm to about 750 nm), and $D_2$ in Equation 2 may be in a range of about 130 nm to about 225 nm, e.g., about 150 nm to about 205 nm.

In one or more exemplary embodiments, the thickness of the transparent layer AT of the first electrode AN may be in a range of about 40 nm to about 130 nm, for example, about 60 nm to about 120 nm.

The first electrode AN may be a conductive layer capable of injection charges (e.g., holes).

The transparent layer AT of the first electrode AN may be a metal oxide layer. The metal in the metal oxide layer may be, for example, indium (In), zinc (Zn), tin (Sn), tungsten (W), molybdenum (Mo), or any combination thereof. In some exemplary embodiments, the metal oxide of the metal oxide layer may be indium tin oxide (ITO), indium zinc oxide (IZO), tin oxide ($SnO_2$), zinc oxide (ZnO), tungsten oxide ($WO_3$), molybdenum oxide ($MO_3$), or any combination thereof. The transparent layer AT of the first electrode AN may be an ITO layer.

The reflective layer AR of the first electrode AN may be a metal layer. In some exemplary embodiments, the metal in the metal layer may be magnesium (Mg), silver (Ag), aluminum (Al), lithium (Li), calcium (CA), indium (In), or any combination thereof. In some exemplary embodiments, the reflective layer AR of the first electrode AN may be an Al layer, an Ag layer, or an Al—Ag alloy layer.

Figure 2:
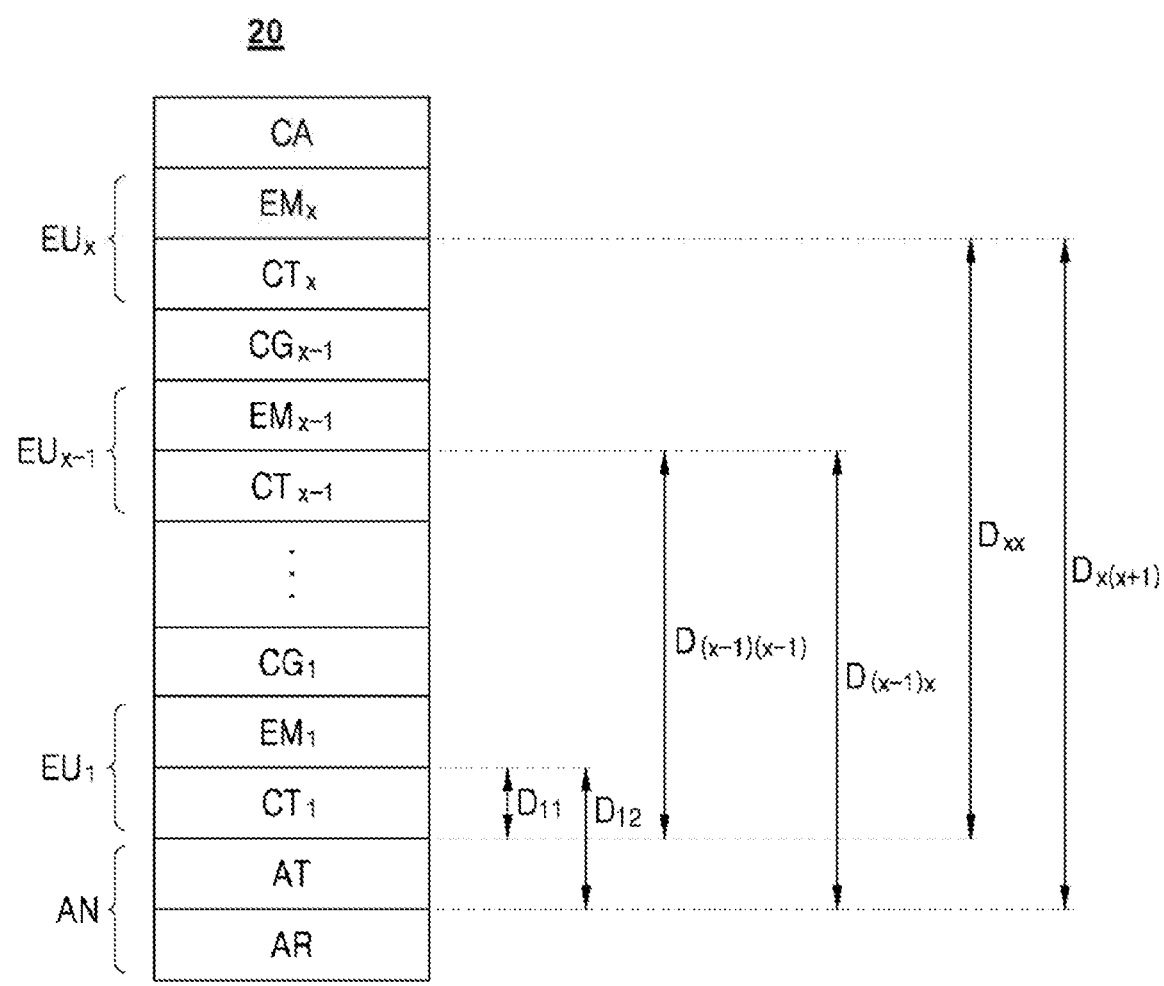
FIG. 2 is a schematic view of a light-emitting device 20 according to another exemplary embodiment.

Description of FIG. 2

The light-emitting device 20 shown in FIG. 2 may have a tandem structure.

The light-emitting device 20 may include: a first electrode AN; a second electrode CA facing the first electrode AN; emission units $EU_1, \ldots, EU_{x-1}$, and $EU_x$ in the number of x that may be stacked between the first electrode AN and the second electrode CA; and x−1 charge generating layer(s) $CG_1, \ldots, CG_{x-1}$ located between each two adjacent emission units from among the emission units in the number of x, each of the x−1 charge generating layer(s) including an n-type charge generating layer and a p-type charge generating layer.

x may be an integer of 2 or greater. In some embodiments, x may be 2 or 3.

The emission units $EU_1, \ldots, EU_{x-1}$, and $EU_x$ in the light-emitting device 20 may respectively include a charge transport region $CT_1, \ldots CT_{x-1}$, or $CT_x$ and an emission layer $EM_1, \ldots EM_{x-1}$, or $EM_x$ sequentially stacked above the first electrode AN. The charge transport regions $CT_1, \ldots CT_{x-1}$, and $CT_x$ and the emission layer $EM_1, \ldots EM_{x-1}$, and $EM_x$ included in the light-emitting device 20 may be understood by referring to the descriptions of the charge transport region CT and the emission layer EM of the light-emitting device 10 of FIG. 1.

Light emitted from the emission units $EU_1, \ldots, EU_{x-1}$, and $EU_x$ may pass to the outside the light-emitting device 20 through the second electrode CA.

The first electrode AN may be a reflective electrode, and the first electrode AN may include a transparent layer AT and a reflective layer AR. The first electrode AN and the second electrode CA of the light-emitting device 20 may respectively be understood by referring to the descriptions of the first electrode AN and the second electrode CA of the light-emitting device 10 shown in FIG. 1.

The light-emitting device 20 may satisfy Equation y:

$$L_y - a_y \leq D_y \leq L_y + a_y \qquad \text{Equation y}$$

wherein, in Equation y, $D_y$ may be a distance between i) an interface between the transparent layer AT of the first electrode AN and the charge transport region $CT_1$ of the first emission units $EU_1$ and ii) an interface between the emission layer of the $y^{th}$ emission unit from among the emission units in the number of x and the charge transport region of the $y^{th}$ emission unit from among the emission units in the number of x, $L_y$ may be a $y^{th}$ resonance distance of light emitted from the emission layer of the $y^{th}$ emission unit from among the emission units $EU_1, EU_{x-1}$, and $EU_x$ in the number of x, and $a_y$ may be a real number in a range of about 0 nm to about 50 nm. $a_y$ may be understood by referring to the description of $a_1$ in FIG. 1.

In some exemplary embodiments, in the light-emitting device 20 of FIG. 2, a distance $D_{(x-1)(x-1)}$ between i) an interface between the transparent layer AT of the first electrode AN and a charge transport region $CT_1$ of the first emission unit $EU_{x-1}$ and ii) an interface between an emission layer $EM_{x-1}$ of the $(x-1)^{th}$ emission unit $EU_1$ and the charge transport region $CT_{x-1}$ of the $(x-1)^{th}$ emission unit $EU_{x-1}$ may be a $(x-1)^{th}$ resonance distance$\pm a_{(x-1)(x-1)}$ of light emitted from the emission layer $EM_{x-1}$ of the $(x-1)^{th}$ emission unit $EU_{x-1}$.

In addition, the light-emitting device 20 may satisfy Equation y+1:

$$L_{y+1} - a_{y+1} \leq D_{y+1} \leq L_{y+1} + a_{y+1} \qquad \text{Equation y+1}$$

wherein, in Equation y+1, $D_{y+1}$ may be a distance between a) an interface between the reflective layer AR of the first electrode AN and the transparent layer AT of the first electrode AN and b) an interface between the emission layer of the $y^{th}$ emission unit from among the emission units in the number of x and the charge transport region of the $y^{th}$ emission unit from among the emission units in the number of x, $L_{y+1}$ may be a $(y+1)^{th}$ resonance distance of light emitted from the emission layer of the $y^{th}$ emission unit from among the emission units in the number of x, and $a_{y+1}$ may be a real number in a range of about 0 nm to about 50 nm. $a_{y+1}$ may be understood by referring to the description of $a_1$ in FIG. 1.

In some exemplary embodiments, in the light-emitting device 20 of FIG. 2, a distance $D_{(x-1)x}$ between a) an interface between the reflective layer AR of the first electrode AN and the transparent layer AT of the first electrode AN and ii) an interface between the emission layer $EM_{x-1}$ of the $(x-1)^{th}$ emission unit $EU_{x-1}$ and the charge transport region $CT_{x-1}$ of the $(x-1)^{th}$ emission unit $EU_{x-1}$ may be a $x^{th}$ resonance distance of light emitted from the emission layer $EM_{x-1}$ of the $(x-1)^{th}$ emission unit $EU_{x-1} \pm a_{(x-1)x}$.

Here, y may be a variable of an integer from 1 to x.

In some exemplary embodiments, at least one of the emission units $EU_1, \ldots, EU_{x-1}$, and $EU_x$ in the number of x in the light-emitting device 20 may emit blue light.

In some exemplary embodiments, a first emission unit $EU_1$ of the light-emitting device 20 may emit blue light.

In the description of the light-emitting device 10 shown in FIG. 1, the descriptions of the electron transport region, effects of controlling the resonance distance, Equation 1A, Equation 1B, Equation 3, and Equation 4 may also be applied to the emission units $EU_1, \ldots, EU_{x-1}$, and $EU_x$ in the number of x of the light-emitting device 20 shown in FIG. 2.

Figure 3:
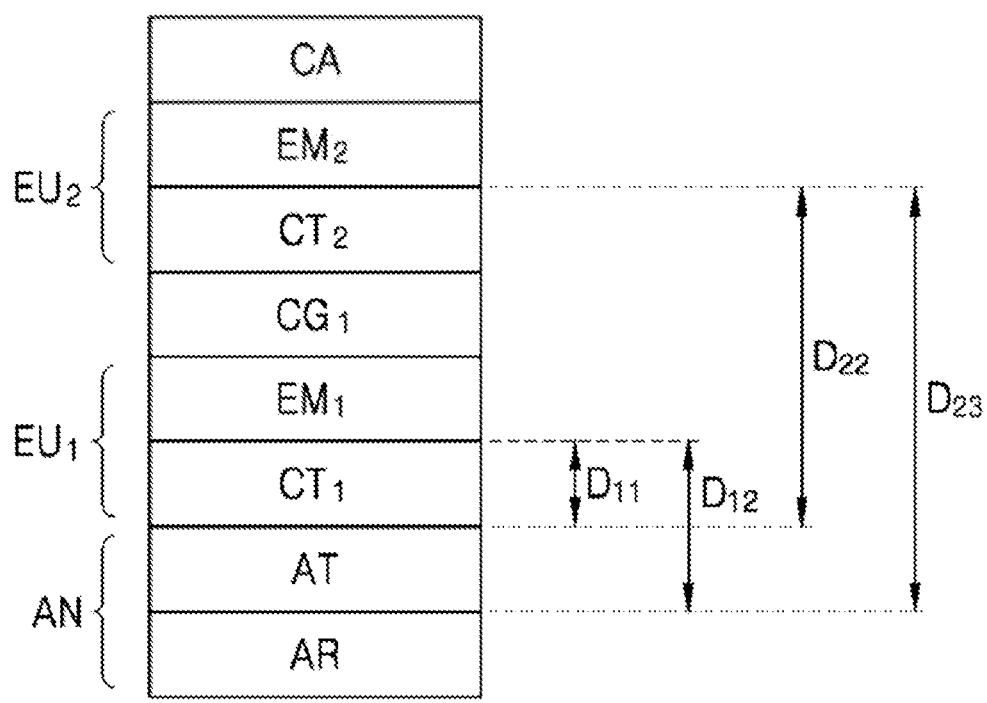
FIG. 3 is a schematic view of a light-emitting device 30 according to still another exemplary embodiment.

Description of FIG. 3

A light-emitting device 30 shown in FIG. 3 has a tandem structure as the light-emitting device 20 of FIG. 2, wherein x is 2.

The light-emitting device 30 of FIG. 3 may include: a first electrode AN; a second electrode CA facing the first electrode AN; a first emission unit $EU_1$ located between the first electrode AN and the second electrode CA; a second emission unit $EU_2$ located between the first emission unit $EU_1$ and the second electrode CA; and a charge generating layer $CG_1$ located between the first emission unit $EU_1$ and the second emission unit $EU_2$ and including an n-type charge generating layer and a p-type charge generating layer.

The first emission unit $EU_1$ may include a first charge transport region $CT_1$ and a first emission layer $EM_1$ that may be sequentially stacked on the first electrode AN, and the second emission unit $EU_2$ may include a second charge transport region $CT_2$ and a second emission layer $EM_2$ that may be sequentially stacked on the first electrode AN. Descriptions of the first charge transport region $CT_1$ and the second charge transport region $CT_2$ in the light-emitting device 30 may each be understood by referring to the descriptions of the charge transport region CT of the light-emitting device 10 in FIG. 1. Descriptions of the first emission layer $EM_1$ and the second emission layer $EM_2$ may each be understood by referring to the descriptions of the emission layer EM of the light-emitting device 10 in FIG. 1.

Light emitted from the first emission unit $EU_1$ and the second emission unit $EU_2$ may pass to the outside the light-emitting device 30 through the second electrode CA.

The first electrode AN may be a reflective electrode, and the first electrode AN may include a transparent layer AT and a reflective layer AR. The first electrode AN and the second electrode CA of the light-emitting device 20 may respectively be understood by referring to the descriptions of the first electrode AN and the second electrode CA of the light-emitting device 10 shown in FIG. 1.

The light-emitting device 30 may satisfy Equation 11:

$$L_{11} - a_{11} \leq D_{11} \leq L_{11} + a_{11} \qquad \text{Equation 11}$$

wherein, in Equation 11, $D_{11}$ may be a distance between i) an interface between the transparent layer AT of the first electrode AN and the first charge transport region $CT_1$ of the first emission unit $EU_1$ and ii) an interface between the first emission layer $EM_1$ of the first emission unit $EU_1$ and the first charge transport region $CT_1$ of the first emission unit $EU_1$, $L_{11}$ may be a first resonance distance of light emitted from the first emission layer $EM_1$ of the first emission unit $EU_1$, and au may be a real number in a range of about 0 nm to about 50 nm. $a_{11}$ may be understood by referring to the description of $a_1$ in FIG. 1.

As the light-emitting device 30 satisfies Equation 11, a thickness of a region, in which organic matters are substantially disposed, between i) an interface between the transparent layer AT of the first electrode AN and the first charge transport region $CT_1$ of the first emission unit $EU_1$ and ii) an interface between the first emission layer $EM_1$ of the first emission unit $EU_1$ and the first charge transport region $CT_1$ of the first emission unit $EU_1$ may be maintained in a relatively small thickness, and thus, the light-emitting device 30 may have a low driving voltage, long lifespan, and a high external light extraction efficiency.

In some exemplary embodiments, $L_{11}$ in Equation 11 may be represented by Equation 11A:

$$L_{11} = \{[(m_{11}-1)+1.5] \times \lambda\}/2r_{11} \qquad \text{Equation 11A}$$

wherein, in Equation 11A, $\lambda$ may be a maximum emission wavelength of light emitted from the first emission layer $EM_1$ of the first emission unit $EU_1$, $r_{11}$ represents an effective refractive index of an region located between the transparent layer AT of the first electrode AN and the first emission layer $EM_1$ of the first emission unit $EU_1$, and $m_{11}$ may be 1.

In addition, the light-emitting device 30 may satisfy Equation 12:

$$L_{12} - a_{12} \leq D_{12} \leq L_{12} + a_{12} \qquad \text{Equation 12}$$

wherein, in Equation 12, $D_{12}$ may be a distance between a) an interface between the reflective layer AR of the first electrode AN and the transparent layer AT of the first electrode AN and b) an interface between the first emission layer $EM_1$ of the first emission unit $EU_1$ and the first charge transport region $CT_1$ of the first emission unit $EU_1$, $L_{12}$ may be a second resonance distance of light emitted from the first emission layer $EM_1$ of the first emission unit $EU_1$, and $a_{12}$ may be a real number in a range of about 0 nm to about 50 nm. $a_{12}$ may be understood by referring to the description of $a_1$ in FIG. 1.

As the light-emitting device 30 satisfies Equation 12, the first emission layer $EM_1$ of the first emission unit $EU_1$ and the reflective layer AR of the first electrode AN may be spaced apart from each other in a proper distance, and thus, light (i.e., light emitted from the first emission layer $EM_1$ of the first emission unit $EU_1$) loss caused by quenching and waveguide due to SPP may be substantially reduced. Accordingly, the light-emitting device 30 may have a high external light extraction efficiency.

In some exemplary embodiments, $L_{12}$ in Equation 12 may be represented by Equation 12A:

$$L_{12} = \{[(m_{12}-1)+1.5] \times \lambda\}/2r_{12} \qquad \text{Equation 12A}$$

wherein, in Equation 12A, $\lambda$ may be a maximum emission wavelength of light emitted from the first emission layer $EM_1$ of the first emission unit $EU_1$, $r_{12}$ represents an effective refractive index of a region located between the reflective layer AR of the first electrode AN and the first emission layer $EM_1$ of the first emission unit $EU_1$, and $m_{12}$ may be 2.

In addition, the light-emitting device 30 may satisfy Equation 22:

$$L_{22} - a_{22} \leq D_{22} \leq L_{22} + a_{22} \qquad \text{Equation 22}$$

wherein, in Equation 22, $D_{22}$ may be a distance between iii) an interface between the transparent layer AT of the first electrode AN and the first charge transport region $CT_1$ of the first emission unit $EU_1$ and iv) an interface between the second emission layer $EM_2$ of the second emission unit $EU_2$ and the second charge transport region $CT_2$ of the second emission unit $EU_2$, $L_{22}$ may be a second resonance distance of light emitted from the second emission layer $EM_2$ of the second emission unit $EU_2$, and $a_{22}$ may be a real number in a range of about 0 nm to about 50 nm. $a_{22}$ may be understood by referring to the description of $a_1$ in FIG. 1.

As the light-emitting device 30 satisfies Equation 22, a thickness of a region, in which organic matters are substantially disposed, between iii) an interface between the transparent layer AT of the first electrode AN and the first charge transport region $CT_1$ of the first emission unit $EU_1$ and iv) an interface between the second emission layer $EM_2$ of the second emission unit $EU_2$ and the second charge transport region $CT_2$ of the second emission unit $EU_2$ may be maintained in a relatively small thickness, and thus, the light-emitting device 30 may have a low driving voltage, long lifespan, and a high external light extraction efficiency.

In some exemplary embodiments, $L_{22}$ in Equation 22 may be represented by Equation 22A:

$$L_{22} = \{[(m_{22}-1)+1.5] \times \lambda\}/2r_{22} \qquad \text{Equation 22A}$$

wherein, in Equation 22A, λ may be a maximum emission wavelength of light emitted from the second emission layer $EM_2$ of the second emission unit $EU_2$, $r_{22}$ represents an effective refractive index of an region located between the transparent layer AT of the first electrode AN and the second emission layer $EM_2$ of the second emission unit $EU_2$, and $m_{22}$ may be 2.

In addition, the light-emitting device 30 may satisfy Equation 23:

$$L_{23}-a_{23} \leq D_{23} \leq L_{23}+a_{23} \quad \text{Equation 23}$$

wherein, in Equation 23, $D_{23}$ may be a distance between c) an interface between the reflective layer AR of the first electrode AN and the transparent layer AT of the first electrode AN and d) an interface between the second emission layer $EM_2$ of the second emission unit $EU_2$ and the second charge transport region $CT_2$ of the second emission unit $EU_2$, $L_{23}$ may be a third resonance distance of light emitted from the second emission layer $EM_2$ of the second emission unit $EU_2$, and $a_{23}$ may be a real number in a range of about 0 nm to about 50 nm. $a_{23}$ may be understood by referring to the description of $a_1$ in FIG. 1.

As the light-emitting device 30 satisfies Equation 23, the second emission layer $EM_2$ of the second emission unit $EU_2$ and the reflective layer AR of the first electrode AN may be spaced apart from each other in a proper distance, and thus, light (i.e., light emitted from the second emission layer $EM_2$ of the second emission unit $EU_2$) loss caused by quenching and waveguide due to SPP may be substantially reduced. Accordingly, the light-emitting device 30 may have a high external light extraction efficiency.

In some exemplary embodiments, $L_{23}$ in Equation 23 may be represented by Equation 23A:

$$L_{23}=\{[(m_{23}-1)+1.5] \times \lambda\}/2r_{23} \quad \text{Equation 23A}$$

wherein, in Equation 23A, λ may be a maximum emission wavelength of light emitted from the second emission layer $EM_2$ of the second emission unit $EU_2$, $r_{23}$ represents an effective refractive index of a region located between the reflective layer AR of the first electrode AN and the second emission layer $EM_2$ of the second emission unit $EU_2$, and $m_{23}$ may be 3.

In some exemplary embodiments, at least one of the first emission unit $EU_1$ and the second emission unit $EU_2$ in the light-emitting device 30 may emit blue light.

In some exemplary embodiments, the first emission unit $EU_1$ of the light-emitting device 30 may emit blue light.

In the description of the light-emitting device 10 shown in FIG. 1, the descriptions of the electron transport region and the like may be applied to the descriptions of the first emission unit $EU_1$ and the second emission unit $EU_2$ of the light-emitting device 30.

According to one or more exemplary embodiments, an electronic apparatus may include the light-emitting device. The electronic apparatus may further include a thin-layer transistor. In some exemplary embodiments, the electronic apparatus may further include a thin-layer transistor including a source electrode and drain electrode, and a first electrode of the light-emitting device may be electrically connected to the source electrode or the drain electrode. The electronic apparatus may further include a color filter, a color-conversion layer, a touchscreen layer, a polarization layer, or any combination thereof. The electronic apparatus may be understood by referring to the description of the electronic apparatus provided herein.

Electronic Apparatus

The light-emitting device 10, 20, or 30 may be included in various electronic apparatuses. In some exemplary embodiments, an electronic apparatus including the light-emitting device 10, 20, or 30 may be an emission apparatus or an authentication apparatus.

The electronic apparatus (e.g., an emission apparatus) may further include, in addition to the light-emitting device 10, 20, or 30, i) a color filter, ii) a color-conversion layer, or iii) a color filter and a color-conversion layer. The color filter and/or the color-conversion layer may be disposed on at least one traveling direction of light emitted from the light-emitting device 10, 20, or 30. For example, light emitted from the light-emitting device 10, 20, or 30 may be blue light or white light. The light-emitting device 10, 20, or 30 may be understood by referring to the descriptions provided herein. In some embodiments, the color-conversion layer may include quantum dots. In one or more embodiments, an electronic apparatus including the light-emitting device 20 or 30 shown in FIGS. 2 and 3, i.e., a tandem light-emitting device, may further include a color-conversion layer, and the color-conversion layer may include quantum dots.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining layer may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area emitting first color light; a second area emitting second color light; and/or a third area emitting third color light, and the first color light, the second color light, and/or the third color light may have different maximum emission wavelengths. In some embodiments, the first color light may be red light, the second color light may be green light, and the third color light may be blue light. In some exemplary embodiments, the plurality of color filter areas (or the plurality of color-conversion areas) may each include quantum dots. In some exemplary embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In some exemplary embodiments, the light-emitting device 10, 20, or 30 may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In some exemplary embodiments, the first light may be blue light, the 1-1 color light may be red light, the 2-1 color light may be green light, and the 3-1 light may be blue light.

The electronic apparatus may further include a thin-layer transistor, in addition to the light-emitting device 10, 20, or 30. The thin-layer transistor may include a source electrode, a drain electrode, and an activation layer, wherein one of the source electrode and the drain electrode may be electrically connected to one of the first electrode and the second electrode of the light-emitting device 10, 20, or 30.

The thin-layer transistor may further include a gate electrode, a gate insulating layer, or the like.

The activation layer may include a crystalline silicon, an amorphous silicon, an organic semiconductor, and an oxide semiconductor.

The electronic apparatus may further include an encapsulation unit for sealing the light-emitting device 10, 20, or 30. The encapsulation unit may be located between the color filter and/or the color-conversion layer and the light-emitting device 10, 20, or 30. The encapsulation unit may allow light to pass to the outside from the light-emitting device 10, 20, or 30 and prevent the air and moisture to permeate to the light-emitting device 10, 20, or 30 at the same time. The encapsulation unit may be a sealing substrate including a transparent glass or a plastic substrate. The encapsulation unit may be a thin-layer encapsulating layer including at least one of an organic layer and/or an inorganic layer. When the encapsulation unit is a thin layer encapsulating layer, the electronic apparatus may be flexible.

In addition to the color filter and/or the color-conversion layer, various functional layers may be disposed on the encapsulation unit depending on the use of an electronic apparatus. Examples of the functional layer may include a touch screen layer, a polarization layer, or the like. The touch screen layer may be a resistive touch screen layer, a capacitive touch screen layer, or an infrared beam touch screen layer. The authentication apparatus may be, for example, a biometric authentication apparatus that identifies an individual according biometric information (e.g., a fingertip, a pupil, or the like).

The authentication apparatus may further include a biometric information collecting unit, in addition to the light-emitting device 10, 20, or 30 described above.

The electronic apparatus may be applicable to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector.

Description of Table

OLED B, OLED B-1, and OLED B-2 were each manufactured according to the structure shown in Table 1.

TABLE 1

| | | OLED B (Example) | OLED B-1 (Comparative Example) | OLED B-2 (Comparative Example) |
|---|---|---|---|---|
| Second electrode (Cathode/AgMg layer) | | 10 nm | 10 nm | 10 nm |
| Electron transport region | | 35 nm | 35 nm | 35 nm |
| Emission layer (that emits blue light having a maximum emission wavelength of 450 nm) | | 20 nm | 20 nm | 20 nm |
| Hole transport region (having an effective refractive index of 1.8) | | 56 nm | 136 nm | 6 nm |
| First electrode (anode) | ITO layer (transparent layer) | 100 nm | 10 nm | 140 nm |
| | Ag layer (reflective layer) | 100 nm | 100 nm | 100 nm |

TABLE 2

| | $L_1$ = 62.50 nm $L_2$ = 168.75 nm[1] | | |
|---|---|---|---|
| | OLED B (Example) | OLED B-1 (Comparative Example) | OLED B-2 (Comparative Example) |
| Satisfy Equation 1 | O | X | X |
| Satisfy Equation 2 | O | O | O |

[1]: an effective refractive index of the region of the hole transport region and the ITO layer is 2.0.

Referring to the results of Tables 1 and 2, OLED B was found to satisfy Equation 1 and Equation 2, and OLEDs B-1 and B-2 were each found not to satisfy at least one of Equation 1 and Equation 2.

The driving voltage (V), luminescence efficiency (cd/A), and lifespan (T90) of the OLED B, OLED B-1, and OLED B-2 were measured at 1,000 cd/m2 by using Keithley source-measure unit SMU 236 and a luminance meter PR650. The results thereof are shown in Table 3. The lifespan (T90) indicates a time (hour) for the luminance of each organic light-emitting device to decline to 90% of its initial luminance. The luminescence efficiency and lifespan in Table 3 are each in a relative value.

TABLE 3

| | Driving voltage (V) | Luminescence efficiency (relative value, %) | Lifespan ($T_{90}$) (relative value, %) |
|---|---|---|---|
| OLED B (Example) | 3.0 | 140 | 120 |
| OLED B-1 (Comparative Example) | 3.8 | 100 | 100 |
| OLED B-2 (Comparative Example) | 3.1 | 95 | 70 |

Referring to the results of Table 3, it was found that OLED B has a low driving voltage, high luminescence efficiency, and long lifespan, as compared with OLED B-1 and OLED B-2.

Subsequently, OLED G, OLED G-1, and OLED G-2 were each manufactured according to the structure shown in Table 4.

TABLE 4

|  |  | OLED G (Example) | OLED G-1 (Comparative Example) | OLED G-2 (Comparative Example) |
|---|---|---|---|---|
| Second electrode (Cathode/AgMg layer) | | 10 nm | 10 nm | 10 nm |
| Electron transport region | | 35 nm | 35 nm | 35 nm |
| Emission layer (that emits green light having a maximum emission wavelength of 525 nm) | | 30 nm | 30 nm | 30 nm |
| Hole transport region (having an effective refractive index of 1.8) | | 66 nm | 156 nm | 16 nm |
| First electrode (anode) | ITO layer (transparent layer) | 100 nm | 10 nm | 150 nm |
| | Ag layer (reflective layer) | 100 nm | 100 nm | 100 nm |

TABLE 5

$L_1 = 72.92$ nm
$L_2 = 196.875$ nm²

|  | OLED G (Example) | OLED G-1 (Comparative Example) | OLED G-2 (Comparative Example) |
|---|---|---|---|
| Satisfy Equation 1 | O | X | X |
| Satisfy Equation 2 | O | O | O |

²: an effective refractive index of the region of the hole transport region and the ITO layer is 2.0.

Referring to the results of Tables 4 and 5, OLED G was found to satisfy Equation 1 and Equation 2, and OLEDs G-1 and G-2 were each found not to satisfy at least one of Equation 1 and Equation 2.

The driving voltage (V), luminescence efficiency (cd/A), and lifespan (T90) of the OLED G, OLED G-1, and OLED G-2 were measured at 7,000 cd/m² by using Keithley source-measure unit SMU 236 and a luminance meter PR650. The results thereof are shown in Table 6. The lifespan (T90) indicates a time (hour) for the luminance of each organic light-emitting device to decline to 90% of its initial luminance. The luminescence efficiency and lifespan in Table 6 are each in a relative value.

TABLE 6

|  | Driving voltage (V) | Luminescence efficiency (relative value, %) | Lifespan (relative value, %) |
|---|---|---|---|
| OLED G (Example) | 3.3 | 130 | 115 |
| OLED G-1 (Comparative Example) | 4.0 | 100 | 100 |
| OLED G-2 (Comparative Example) | 3.2 | 80 | 80 |

Referring to the results of Table 6, it was found that OLED G has a low driving voltage, high luminescence efficiency, and long lifespan, as compared with OLED G-1 and OLED G-2.

Subsequently, OLED R, OLED R-1, and OLED R-2 were each manufactured according to the structure shown in Table 7.

TABLE 7

|  |  | OLED R (Example) | OLED R-1 (Comparative Example) | OLED R-2 (Comparative Example) |
|---|---|---|---|---|
| Second electrode (Cathode/AgMg layer) | | 10 nm | 10 nm | 10 nm |
| Electron transport region | | 35 nm | 35 nm | 35 nm |
| Emission layer (that emits red light having a maximum emission wavelength of 620 nm) | | 40 nm | 40 nm | 40 nm |
| Hole transport region (having an effective refractive index of 1.8) | | 83 nm | 173 nm | 33 nm |
| First electrode (anode) | ITO layer (transparent layer) | 100 nm | 10 nm | 150 nm |
| | Ag layer (reflective layer) | 100 nm | 100 nm | 100 nm |

TABLE 8

| | OLED R (Example) | OLED R-1 (Comparative Example) | OLED R-2 (Comparative Example) |
|---|---|---|---|
| | $L_1$ = 86.11 nm | | |
| | $L_2$ = 232.5 nm³ | | |
| Satisfy Equation 1 | ○ | X | X |
| Satisfy Equation 2 | ○ | ○ | ○ |

³: an effective refractive index of the region of the hole transport region and the ITO layer is 2.0.

Referring to the results of Tables 7 and 8, OLED G was found to satisfy Equation 1 and Equation 2, and OLEDs G-1 and G-2 were each found not to satisfy at least one of Equation 1 and Equation 2.

The driving voltage (V), luminescence efficiency (cd/A), and lifespan (T90) of the OLED R, OLED R-1, and OLED R-2 were measured at 3,500 cd/m2 by using Keithley source-measure unit SMU 236 and a luminance meter PR650. The results thereof are shown in Table 9. The lifespan (T90) indicates a time (hour) for the luminance of each organic light-emitting device to decline to 90% of its initial luminance. The luminescence efficiency and lifespan in Table 9 are each in a relative value.

TABLE 9

| | Driving voltage (V) | Luminescence efficiency (relative value, %) | Lifespan (relative value, %) |
|---|---|---|---|
| OLED R (Example) | 3.4 | 130 | 110 |
| OLED R-1 (Comparative Example) | 4.1 | 100 | 100 |
| OLED R-2 (Comparative Example) | 3.2 | 90 | 80 |

Referring to the results of Table 9, it was found that OLED R has a low driving voltage, high luminescence efficiency, and long lifespan, as compared with OLED R-1 and OLED R-2.

As apparent from the foregoing description, the light-emitting device may have a low driving voltage, high luminescence efficiency, and long lifespan, and thus, a high quality electronic apparatus may be manufactured by using the light-emitting device.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:
   a first electrode;
   a second electrode facing the first electrode;
   an emission layer located between the first electrode and the second electrode; and
   a charge transport region located between the emission layer and the first electrode,
   wherein:
   light emitted from the emission layer passes to the outside through the second electrode;
   the first electrode is a reflective electrode;
   the first electrode comprises a transparent layer and a reflective layer; and
   Equation 1, Equation 2, and Equation 4 are satisfied as follows:

$$L_1 - a_1 \leq D_1 \leq L_1 + a_1 \quad \text{Equation 1}$$

wherein, in Equation 1, $D_1$ is a distance between i) an interface between the transparent layer of the first electrode and the charge transport region and ii) an interface between the emission layer and the charge transport region, $L_1$ is a first resonance distance of light emitted from the emission layer, and $a_1$ is a real number in a range of about 0 nanometers (nm) to about 50 nm, $$L_2 - a_2 \leq D_2 \leq L_2 + a_2 \quad \text{Equation 2}$$

wherein, in Equation 2, $D_2$ is a distance between a) an interface between the reflective layer of the first electrode and the transparent layer of the first electrode and b) an interface between the emission layer and the charge transport region, $L_2$ is a second resonance distance of light emitted from the emission layer, and $a_2$ is a real number in a range of about 0 nm to about 50 nm, and $$n_1 - n_2 \geq 0.1 \quad \text{Equation 4}$$

wherein, in Equation 4, $n_1$ is a refractive index of the transparent layer of the first electrode, and $n_2$ is a refractive index of a layer in direct contact with the transparent layer of the first electrode from among layers comprised in the charge transport region.

2. The light-emitting device of claim 1, wherein light emitted from the emission layer is blue light having a maximum emission wavelength in a range of about 440 nm to about 480 nm, green light having a maximum emission wavelength in a range of about 510 nm to about 550 nm, or red light having a maximum emission wavelength in a range of about 610 nm to about 640 nm.

3. The light-emitting device of claim 1, wherein $L_1$ in Equation 1 is represented by Equation 1A:

$$L_1 = \{[(m_1-1)+0.5] \times \lambda\}/2r_1 \quad \text{Equation 1A}$$

wherein, in Equation 1A, $\lambda$ represents a maximum emission wavelength of light emitted from the emission layer, $r_1$ represents an effective refractive index of a region located between the transparent layer of the first electrode and the emission layer, and $m_1$ is 1.

4. The light-emitting device of claim 3, wherein $r_1$ is in a range of about 1.5 to about 2.1.

5. The light-emitting device of claim 1, wherein $L_2$ in Equation 2 is represented by Equation 2A:

$$L_2 = \{[(m_2-1)+0.5] \times \lambda\}/2r_2 \quad \text{Equation 2A}$$

wherein, in Equation 2A, $\lambda$ represents a maximum emission wavelength of light emitted from the emission layer, $r_2$ represents an effective refractive index of a region located between the reflective layer of the first electrode and the emission layer, and $m_2$ is 2.

6. The light-emitting device of claim 5, wherein $r_2$ is in a range of about 1.6 to about 2.5.

7. The light-emitting device of claim 1, wherein Equation 3 is satisfied as follows:

$$n_1 \geq n_2 \quad \text{Equation 3}$$

wherein, in Equation 3, $n_1$ is a refractive index of the transparent layer of the first electrode, and $n_2$ is a refractive index of a layer in direct contact with the transparent layer of the first electrode from among layers comprised in the charge transport region.

8. The light-emitting device of claim 1, wherein light emitted from the emission layer is blue light, and $D_1$ in Equation 1 is in a range of about 10 nm to about 60 nm.

9. The light-emitting device of claim 1, wherein light emitted from the emission layer is blue light, and $D_2$ in Equation 2 is in a range of about 50 nm to about 180 nm.

10. The light-emitting device of claim 1, wherein light emitted from the emission layer is green light, and $D_1$ in Equation 1 is in a range of about 40 nm to about 95 nm.

11. The light-emitting device of claim 1, wherein light emitted from the emission layer is green light, and $D_2$ in Equation 2 is in a range of about 80 nm to about 215 nm.

12. The light-emitting device of claim 1, wherein light emitted from the emission layer is red light, and $D_1$ in Equation 1 is in a range of about 60 nm to about 145 nm.

13. The light-emitting device of claim 1, wherein light emitted from the emission layer is red light, and $D_2$ in Equation 2 is in a range of about 130 nm to about 225 nm.

14. The light-emitting device of claim 1, wherein the first electrode is a conductive layer.

15. The light-emitting device of claim 1, wherein the transparent layer of the first electrode is a metal oxide layer, and the reflective layer of the first electrode is a metal layer.

16. An electronic apparatus comprising the light-emitting device of claim 1.

17. A light-emitting device comprising:
a first electrode;
a second electrode facing the first electrode;
emission units in the number of x stacked between the first electrode and the second electrode; and
x−1 charge generating layer(s) located between each two adjacent emission units from among the emission units in the number of x, each of the x−1 charge generating layer(s) comprising an n-type charge generating layer and a p-type charge generating layer,
wherein:
x is an integer of 2 or greater;
each of the emission units in the number of x comprise a charge transport region and an emission layer that are sequentially stacked above the first electrode;
light emitted from the emission units in the number of x passes to the outside through the second electrode;
the first electrode is a reflective electrode;
the first electrode comprises a transparent layer and a reflective layer, wherein the transparent layer of the first electrode is a metal oxide layer including tungsten or molybdenum; and
Equation y, Equation y+1, and Equation y+3 are satisfied as follows:

$$L_y - a_y \leq D_y \leq L_y + a_y \qquad \text{Equation y}$$

wherein, in Equation y, $D_y$ is a distance between i) an interface between the transparent layer of the first electrode and the charge transport region of a first emission unit from among the emission units and ii) an interface between the emission layer of the $y^{th}$ emission unit from among the emission units in the number of x and the charge transport region of the $y^{th}$ emission unit from among the emission units in the number of x, $L_y$ is a $y^{th}$ resonance distance of light emitted from the emission layer of the $y^{th}$ emission unit from among the emission units in the number of x, and $a_y$ is a real number in a range of about 0 nm to about 50 nm, $$L_{y+1} - a_{y+1} \leq D_{y+1} \leq L_{y+1} + a_{y+1} \qquad \text{Equation y+1}$$

wherein, in Equation y+1, $D_{y+1}$ is a distance between a) an interface between the reflective layer of the first electrode and the transparent layer of the first electrode and b) an interface between the emission layer of the $y^{th}$ emission unit from among the emission units in the number of x and the charge transport region of the $y^{th}$ emission unit from among the emission units in the number of x, $L_{y+1}$ is a $(y+1)^{th}$ resonance distance of light emitted from the emission layer of the $y^{th}$ emission unit from among the emission units in the number of x, and $a_{y+1}$ is a real number in a range of about 0 nm to about 50 nm, and $$n_1 - n_2 \geq 0.1 \qquad \text{Equation y+3}$$

wherein, in Equation y+3, $n_1$ is a refractive index of the transparent layer of the first electrode, and $n_2$ is a refractive index of a layer in direct contact with the transparent layer of the first electrode from among layers comprised in the charge transport region.

18. The light-emitting device of claim 17, wherein x is 2.

19. A light-emitting device comprising:
a first electrode;
a second electrode facing the first electrode;
a first emission unit located between the first electrode and the second electrode;
a second emission unit located between the first emission unit and the second electrode; and
a charge generating layer located between the first emission unit and the second emission unit and comprising an n-type charge generating layer and a p-type charge generating layer,
wherein:
the first emission unit comprises a first charge transport region and a first emission layer that are sequentially stacked on the first electrode;
the second emission unit comprises a second charge transport region and a second emission layer that are sequentially stacked on the first electrode;
light emitted from the first emission unit and the second emission unit passes to the outside through the second electrode;
the first electrode is a reflective electrode;
the first electrode comprises a transparent layer and a reflective layer; and
Equation 11, Equation 12, Equation 22, and Equation 23 are satisfied as follows:

$$L_{11} - a_{11} \leq D_{11} \leq L_{11} + a_{11} \qquad \text{Equation 11}$$

wherein, in Equation 11,
$D_{11}$ is a distance between i) an interface between the transparent layer of the first electrode and the first charge transport region of the first emission unit and ii) an interface between the first emission layer of the first emission unit and the first charge transport region of the first emission unit, $L_{11}$ is a first resonance distance of light emitted from the first emission layer of the first emission unit, and $a_{11}$ is a real number in a range of about 0 nm to about 50 nm;

$$L_{12} - a_{12} \leq D_{12} \leq L_{12} + a_{12} \qquad \text{Equation 12}$$

wherein, in Equation 12, $D_{12}$ is a distance between a) an interface between the reflective layer of the first electrode and the transparent layer of the first electrode and b) an interface between the first emission layer of the first emission unit and the first charge transport region of the first emission unit, $L_{12}$ is a second resonance distance of light emitted from the first emission layer of the first emission unit, and $a_{12}$ is a real number in a range of about 0 nm to about 50 nm;

$$L_{22} - a_{22} \leq D_{22} \leq L_{22} + a_{22} \qquad \text{Equation 22}$$

wherein, in Equation 22, $D_{22}$ is a distance between iii) an interface between the transparent layer of the first electrode and the second charge transport region of the second emission unit and iv) an interface between the second emission layer of the second emission unit and the second charge transport region of the second emission unit, $L_{22}$ is a second resonance distance of light emitted from the second emission layer of the second emission unit, and $a_{22}$ is a real number in a range of about 0 nm to about 50 nm; and $$L_{23} - a_{23} \leq D_{23} \leq L_{23} + a_{23} \qquad \text{Equation 23}$$

wherein, in Equation 23, $D_{23}$ is a distance between c) an interface between the reflective layer of the first electrode and the transparent layer of the first electrode and d) an interface between the second emission layer of the second emission unit and the second charge transport region of the second emission unit, $L_{23}$ is a third resonance distance of light emitted from the second emission layer of the second emission unit, and $a_{23}$ is a real number in a range of about 0 nm to about 50 nm.

* * * * *